(12) United States Patent
Miwa et al.

(10) Patent No.: US 11,735,394 B2
(45) Date of Patent: Aug. 22, 2023

(54) CHARGED PARTICLE BEAM APPARATUS

(71) Applicant: Hitachi High-Tech Corporation, Tokyo (JP)

(72) Inventors: Takafumi Miwa, Tokyo (JP); Seiichiro Kanno, Tokyo (JP); Go Miya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 148 days.

(21) Appl. No.: 17/295,978

(22) PCT Filed: Nov. 30, 2018

(86) PCT No.: PCT/JP2018/044109
§ 371 (c)(1),
(2) Date: May 21, 2021

(87) PCT Pub. No.: WO2020/110276
PCT Pub. Date: Jun. 4, 2020

(65) Prior Publication Data
US 2022/0028650 A1 Jan. 27, 2022

(51) Int. Cl.
*H01J 37/244* (2006.01)
*H01J 37/20* (2006.01)
(Continued)

(52) U.S. Cl.
CPC .......... *H01J 37/244* (2013.01); *H01J 37/20* (2013.01); *H01J 37/22* (2013.01); *H01J 37/26* (2013.01)

(58) Field of Classification Search
CPC .......... H01J 37/244; H01J 37/20; H01J 37/22; H01J 37/26; H01J 37/226; H01J 2237/221; H01J 2237/24585
See application file for complete search history.

(56) References Cited

U.S. PATENT DOCUMENTS 6,172,363 B1 * 1/2001 Shinada .............. G01R 31/307
850/10
2003/0094572 A1 5/2003 Matsui et al.
(Continued)

FOREIGN PATENT DOCUMENTS

CN 104157593 A 11/2014
JP H06120311 A 4/1994
(Continued)

OTHER PUBLICATIONS

Office Action dated Apr. 12, 2022 in Japanese Application No. 2020-557497.
(Continued)

*Primary Examiner* — David A Vanore
(74) *Attorney, Agent, or Firm* — Miles & Stockbridge, P.C.

(57) ABSTRACT

Provided is a charged particle beam apparatus capable of analyzing foreign matters generated when a sample is transported or observed. The charged particle beam apparatus includes a sample stage on which a measurement sample is provided, a charged particle beam source that irradiates the measurement sample with a charged particle beam, and a detector that detects charged particles emitted by irradiation with the charged particle beam, and includes a foreign matter observation sample held on the sample stage together with the measurement sample and a foreign matter observation unit that causes a foreign matter to be observed on the foreign matter observation sample.

11 Claims, 10 Drawing Sheets

(51) Int. Cl.
*H01J 37/22* (2006.01)
*H01J 37/26* (2006.01)

(56) References Cited

U.S. PATENT DOCUMENTS

| | | | |
|---|---|---|---|
| 2004/0040662 A1* | 3/2004 | Edamura | H01J 37/32477 |
| | | | 156/345.48 |
| 2004/0168767 A1* | 9/2004 | Kanno | H01L 21/67248 |
| | | | 156/345.52 |
| 2006/0186351 A1 | 8/2006 | Nishiyama et al. | |
| 2008/0029699 A1 | 2/2008 | Kaneoka et al. | |
| 2013/0248709 A1 | 9/2013 | Yamamoto et al. | |
| 2015/0279609 A1 | 10/2015 | Tanii et al. | |
| 2015/0340198 A1* | 11/2015 | Nakagawa | H01J 37/185 |
| | | | 250/441.11 |
| 2016/0013010 A1* | 1/2016 | Kanno | H01J 37/21 |
| | | | 250/440.11 |
| 2020/0006032 A1* | 1/2020 | Miwa | H01J 37/026 |
| 2022/0028650 A1* | 1/2022 | Miwa | H01J 37/244 |

FOREIGN PATENT DOCUMENTS

| | | |
|---|---|---|
| JP | H07120404 A | 5/1995 |
| JP | H08-250059 | 9/1996 |
| JP | H10223168 A | 8/1998 |
| JP | 2000222033 A | 8/2000 |
| JP | 2000329662 A | 11/2000 |
| JP | 2002118158 A | 4/2002 |
| JP | 2003151483 A | 5/2003 |
| JP | 2008041464 A | 2/2008 |
| JP | 2009259878 A | 11/2009 |
| JP | 2010-129246 | 6/2010 |
| KR | 10-2008-0056498 | 6/2008 |
| TW | I464394 B | 12/2014 |
| TW | 201637063 A | 10/2016 |
| TW | 201820377 A | 6/2018 |
| WO | 2014061738 A1 | 4/2014 |

OTHER PUBLICATIONS

Search Report dated Feb. 5, 2019 in International Application No. PCT/JP2018/044109.
Written Opinion dated Feb. 5, 2019 in International Application No. PCT/JP2018/044109.
Office Action dated Apr. 24, 2020 in Taiwanese Application No. 108138147.
Office Action dated Jan. 21, 2021 in Taiwanese Application No. 108138147.
Office Action dated Jan. 14, 2023 in Korean Application No. 10-2021-7013981.

* cited by examiner

| POSITION | PARTICLE SIZE | SHAPE | COMPOSITION | GENERATION FACTOR |
|---|---|---|---|---|
| (X1、Y1) | PARTICLE SIZE 1 | SHAPE 1 | COMPOSITION 1, COMPOSITION 2, ... | FACTOR 1 |
| | | | COMPOSITION 1', COMPOSITION 2', ... | FACTOR 2 |
| | | | ⋮ | ⋮ |
| | | SHAPE 2 | COMPOSITION 1'', COMPOSITION 2'', ... | FACTOR 1 |
| | | | ⋮ | ⋮ |
| | | ⋮ | ⋮ | ⋮ |
| | PARTICLE SIZE 2 | ⋮ | ⋮ | ⋮ |
| (X2、Y2) | ⋮ | | | |
| ⋮ | | | | |

[FIG. 10]

CHARGED PARTICLE BEAM APPARATUS

TECHNICAL FIELD

The present invention relates to a charged particle beam apparatus, and particularly relates to a technique for analyzing foreign matters generated in a manufacturing process of a semiconductor device.

BACKGROUND ART

A charged particle beam apparatus such as an electron microscope and an ion microscope is used for observing various samples having fine configurations, and is used for a dimension measurement, a defect inspection and the like of a pattern formed on a semiconductor wafer, particularly in a manufacturing process of a semiconductor device. In order to maintain the yield of a semiconductor device, it is necessary to prevent the generation of foreign matters in the manufacturing process, and when the foreign matters are generated, it is necessary to analyze a generation position and take a measure against the foreign matters according to the generation position.

PTL 1 discloses that in order to easily analyze foreign matters adhered to a semiconductor wafer, dummy wafers that are passed through the manufacturing process instead of semiconductor wafers are provided with holes that can be distinguished from foreign matters with high accuracy, and positions where foreign matters are likely to adhere are analyzed based on the holes.

CITATION LIST

Patent Literature

PTL 1: JP-A-6-120311

SUMMARY OF INVENTION

Technical Problem

However, PTL 1 does not give consideration to foreign matters generated when the semiconductor wafer serving as a sample is transported into the charged particle beam apparatus or observed by the charged particle beam apparatus. When the semiconductor wafer is transported into the charged particle beam apparatus, foreign matters may be generated due to friction and the like of a transport mechanism and adhere to a sample. In the observation of the charged particle beam apparatus, in accordance with changes in observation conditions such as an observation view field or an observation magnification, an electromagnetic field around the sample changes. Changes in the electromagnetic field are generation factors of foreign matters, and thus the foreign matters may adhere to the sample when the sample is observed.

Here, an object of the invention is to provide a charged particle beam apparatus capable of analyzing foreign matters generated when a sample is transported or observed.

Solution to Problem

In order to achieve the above-mentioned object, the invention provides a charged particle beam apparatus including a sample stage on which a measurement sample is provided, a charged particle beam source that irradiates the measurement sample with a charged particle beam, and a detector that detects charged particles emitted by irradiation with the charged particle beam, and including a foreign matter observation sample held on the sample stage together with the measurement sample and a foreign matter observation unit that causes a foreign matter to be observed on the foreign matter observation sample.

Advantageous Effect

According to the invention, a charged particle beam apparatus capable of analyzing foreign matters generated when a sample is transported or observed can be provided.

DESCRIPTION OF EMBODIMENTS

Hereinafter, embodiments of a charged particle beam apparatus according to the invention will be described with reference to the accompanying drawings. The charged particle beam apparatus is an apparatus that observes and processes a sample by irradiating the sample with a charged particle beam, and there are various apparatuses such as a scanning electron microscope, a scanning ion microscope, and a scanning transmission electron microscope. Hereinafter, as an example of the charged particle beam apparatus, a scanning electron microscope that allows a sample to be observed using an electron beam which is one of the charged particle beams will be described.

First Embodiment

Figure 1:
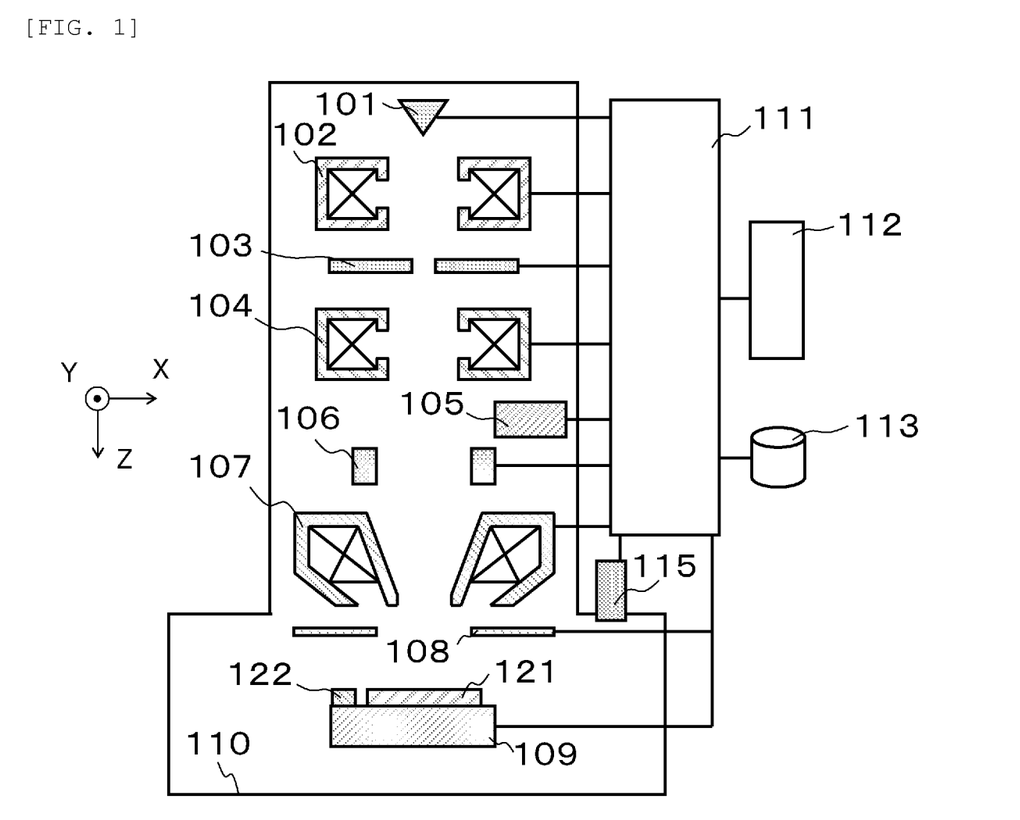
FIG. 1 is an overall configuration diagram showing a scanning electron microscope which is an example of a charged particle beam apparatus.

An overall configuration of a scanning electron microscope according to the present embodiment will be described with reference to FIG. 1. In FIG. 1, a vertical direction is defined as a Z direction, and horizontal directions are defined as an X direction and a Y direction.

In a housing 110 of the scanning electron microscope, an electron gun 101, first condenser lenses 102, apertures 103, second condenser lenses 104, a detector 105, scanning deflectors 106, objective lenses 107, shield electrodes 108, and a sample stage 109 are provided. A measurement sample 121, which is a sample for observation, inspection, and measurement, is held on the sample stage 109. An electron beam emitted from the electron gun 101 passes through the first condenser lenses 102, the apertures 103, the second condenser lenses 104, the scanning deflectors 106, the objective lenses 107, the shield electrodes 108, and the like, and is deflected and focused. Accordingly, a measurement position of the measurement sample 121 is irradiated with the electron beam.

The housing 110 includes a sample chamber in which the sample stage 109 is provided, and the sample chamber is exhausted by a vacuum pump (not shown). Operations of the electron gun 101, the first condenser lenses 102, the aperture 103, the second condenser lenses 104, the scanning deflectors 106, the objective lenses 107, the shield electrodes 108, the sample stage 109, and the like are controlled by a control unit 111.

Charged particles such as a secondary electron and a back-scattered electron, which are emitted from the measurement sample 121 by the irradiation with the electron beam, are detected by a detector 105. The detector 105 outputs a detection signal of the charged particles to the control unit 111. The control unit 111 forms an image of the measurement sample 121 based on the detection signal, and displays the image on a display unit provided in an input and output unit 112, or stores the image in a storage unit 113. The display unit may be provided as a separate body separated from the input and output unit 112. The formed image is used for a measurement such as a dimension measurement and a defect inspection for the measurement sample 121.

In an observation of the measurement sample 121, a user changes an observation condition such as an observation view field and an observation magnification as necessary. A change in the observation condition may change the electromagnetic field around the measurement sample 121 and cause a foreign matter to adhere to the measurement sample 121. However, it is difficult for an operator observing the measurement sample 121 to distinguish whether the foreign matter adhering to the measurement sample 121 adheres to the measurement sample 121 during the observation or before the observation.

Here, in the present embodiment, a foreign matter observation sample 122 that is held on the sample stage 109 together with the measurement sample 121 and is used for observing the foreign matter is provided. In the observation of the foreign matter observation sample 122, a foreign matter observation unit 115 is used. The foreign matter observation unit 115 is, for example, an optical microscope. The foreign matter observation unit 115 may be used for measurement alignment and the like for the measurement sample 121.

Figure 2:
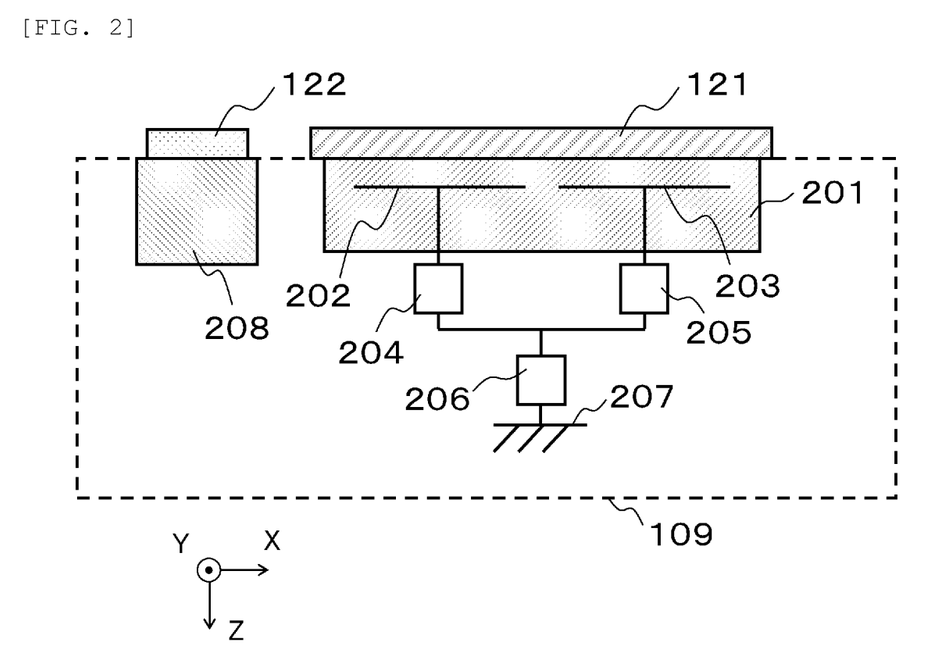
FIG. 2 is a diagram showing a sample stage according to a first embodiment.

The sample stage 109 according to the present embodiment will be described with FIG. 2. The sample stage 109 according to the present embodiment moves in the sample chamber by a movement mechanism (not shown) and is provided with an electrostatic chuck 201 and a holding base 208.

The electrostatic chuck 201 holds the measurement sample 121 and includes electrostatic chuck electrodes 202 and 203, for example, inside a high-resistance alumina-based disk. The electrostatic chuck electrodes 202 and 203 are applied with voltages from electrostatic chuck power sources 204 and 205 that are connected to the electrostatic chuck electrodes 202 and 203, respectively, and constitute a bipolar type electrostatic chuck. If the measurement sample 121 can be held, the electrostatic chuck 201 may not be the bipolar type electrostatic chuck, and may be, for example, a holder type electrostatic chuck that mechanically holds the measurement sample 121. Furthermore, both the electrostatic chuck power sources 204 and 205 may be connected to a retarding power source 206. When the electrostatic chuck power sources 204 and 205 are connected to the retarding power source 206, each of the measurement sample 121 and the electrostatic chuck electrodes 202 and 203 is applied with a retarding voltage, and a so-called retarding method can be applied. The retarding power source 206 is connected to a ground 207.

The holding base 208 holds the foreign matter observation sample 122 and is provided in the vicinity of the measurement sample 121, for example, at a position where an electromagnetic field substantially equivalent to an electromagnetic field formed on the measurement sample 121 is formed. That is, environments of the foreign matter observation sample 122 and the measurement sample 121 are substantially the same. The foreign matter observation sample 122 and the holding base 208 are bonded to each other with, for example, a conductive adhesive so that the foreign matter observation sample 122 is not charged. Furthermore, the foreign matter observation sample 122 is sufficiently smaller in size than the measurement sample 121 such that the foreign matter observation sample 122 can be observed in a short time, and is formed by, for example, a piece-shaped Si wafer. A surface of the foreign matter observation sample 122 is preferably a mirror surface such that the surface can be easily observed. Prior to observing the measurement sample 121, the foreign matter observation sample 122 is in a state in which the foreign matter has been removed, or in a state in which the position and the number of the foreign matters have been checked.

In the sample chamber of the scanning electron microscope, by a voltage applied to control a track of the electron beam and to hold the measurement sample 121, an electromagnetic field is formed. The formed electromagnetic field may scatter the foreign matter in the sample chamber and may cause the foreign matter to adhere to the measurement sample 121. Even in such a case, according to the configuration of the present embodiment, the foreign matter observation sample 122 is held on the sample stage 109 together with the measurement sample 121. Therefore, by observing the presence or absence of the foreign matter on the foreign matter observation sample 122, the increase number of the foreign matters, and the like, the foreign matter adhering to the measurement sample 121 can be estimated.

Figure 3:
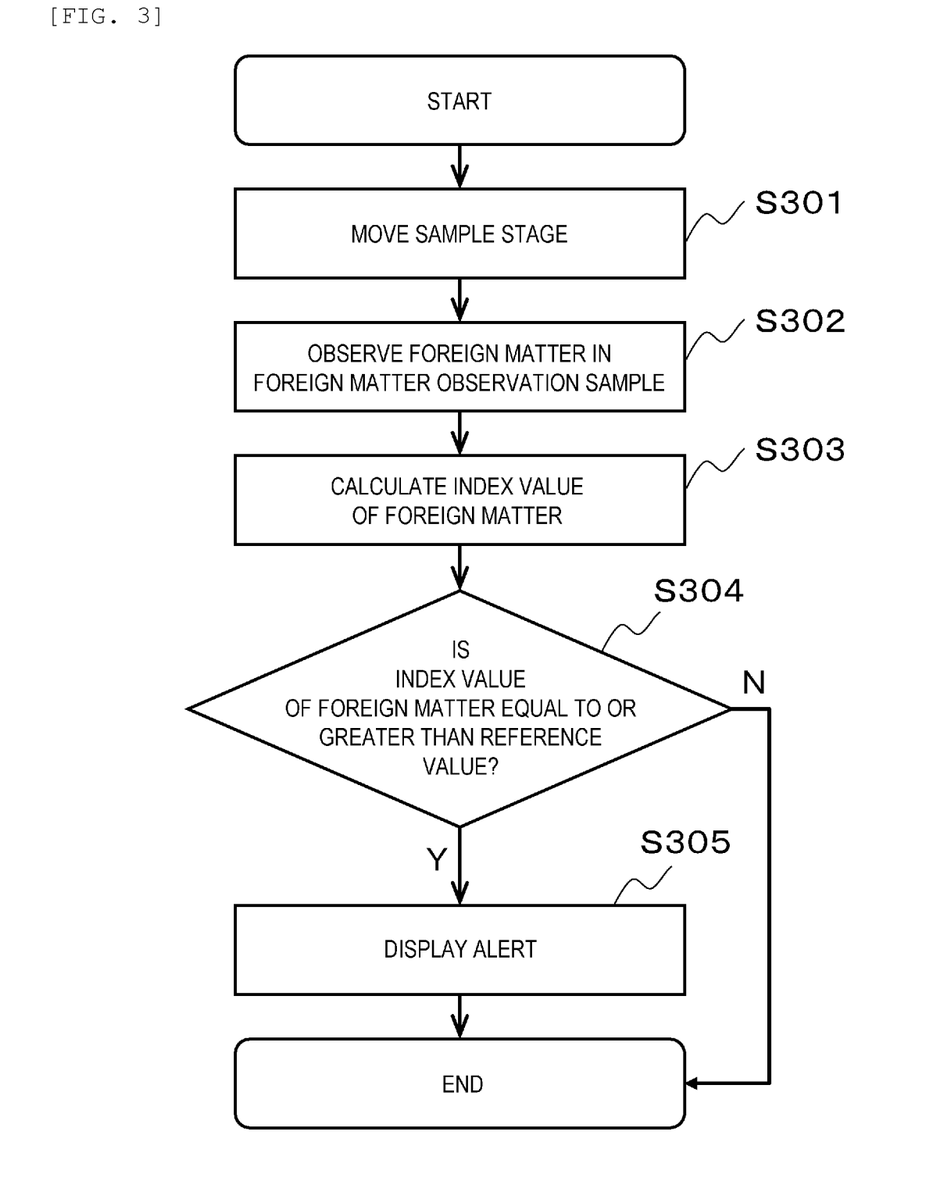
FIG. 3 is a diagram showing an example of a processing flow according to the first embodiment.

An example of a processing flow according to the present embodiment based on the configuration described with reference to FIGS. 1 and 2 will be described with reference to FIG. 3.

(S301)

The control unit 111 moves the sample stage 109 to a position where the foreign matter observation sample 122 can be observed by the foreign matter observation unit 115.

(S302)

The foreign matter observation sample 122 is observed by the foreign matter observation unit 115. When the foreign matter observation unit 115 is an optical microscope, any observation of dark field observation, bright field observation, differential interference observation, polarization observation, phase difference observation, and the like is performed. It is preferable that the foreign matter observation sample 122 has a different surface roughness or is made of a different material from other members in the housing 110 excluding the measurement sample 121. By using the foreign matter observation sample 122 whose surface roughness and material are different from those of other members in the housing 110, it becomes easy to detect the foreign matter by the observation in this step.

(S303)

The control unit 111 calculates an index value of the foreign matter based on the observation in S302. The calculated index value of the foreign matter includes, for example, the total number of the foreign matters, the number of the foreign matters classified into a specific shape, the number of the foreign matters classified into a certain particle size range, and an occupied area of the foreign matter per unit area. The number of the foreign matters increased due to a specific operation, for example, transporting the measurement sample 121 into the sample chamber or executing a series of measurement procedures, may be used as an index value of the foreign matter.

(S304)

The control unit 111 determines whether the index value of the foreign matter calculated in S303 is equal to or greater than a reference value. If the index value is equal to or greater than the reference value, the process proceeds to S305, and if the index value is less than the reference value, the process ends. The reference value may a predetermined value stored in the storage unit 113 or may be a value set by the user. The reference value may be set based on a detection sensitivity and a throughput of the foreign matter. That is, the reference value may be set such that the detection sensitivity is increased so that even a very small foreign matter can be detected, or the throughput is prioritized even if the detection sensitivity is decreased.

(S305)

The control unit 111 displays an alert on a display unit of the input and output unit 112. By displaying the alert, it is possible to notify the user that the index value of the foreign matter in the foreign matter observation sample 122 is equal to or greater than the reference value.

According to the processing flow described above, the state of the foreign matter in the foreign matter observation sample 122 can be notified to the user, and thus the user can estimate the state of the foreign matter in the measurement sample 121 held in the vicinity of the foreign matter observation sample 122. That is, according to the present embodiment, the charged particle beam apparatus capable of analyzing the foreign matter generated when the sample is transported or observed can be provided.

Second Embodiment

In the first embodiment, it has been described that by observing the foreign matter in the foreign matter observation sample 122 provided in the vicinity of the measurement sample 121, the state of the foreign matter of the measurement sample 121 is estimated. In the present embodiment, in order to estimate the foreign matter of the measurement sample 121 with higher accuracy, the environment of the foreign matter observation sample 122 is brought closer to the environment of the measurement sample 121. Matters described in the first embodiment and not described in the present embodiment can also be applied to the present embodiment unless there are special circumstances.

Figure 4:
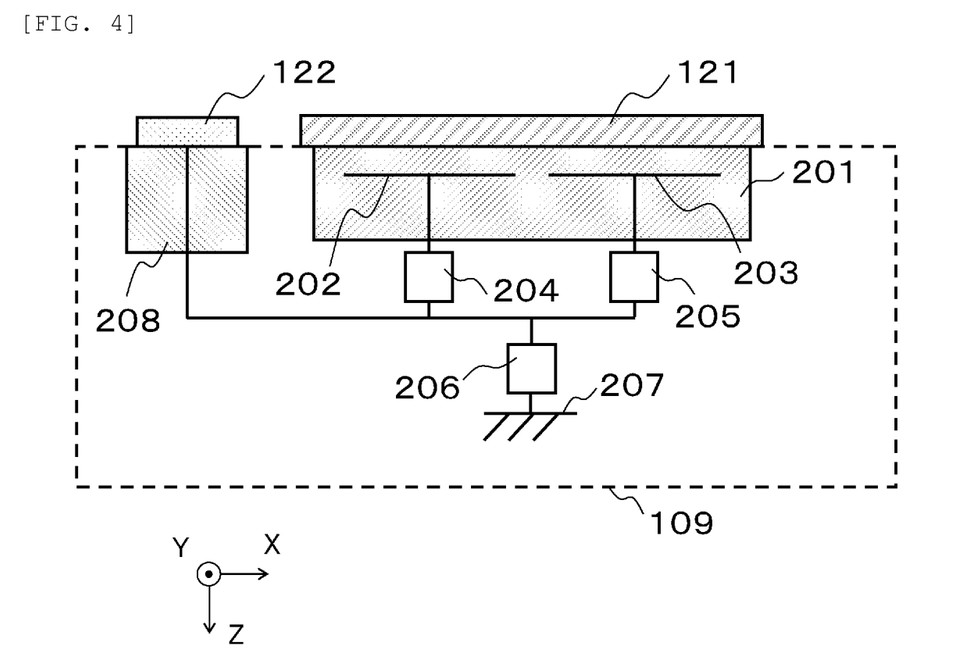
FIG. 4 is a diagram showing a sample stage according to a second embodiment.

The sample stage 109 according to the present embodiment will be described with reference to FIG. 4. Reference signs that are the same as those in the drawings referred to in the first embodiment show the same or corresponding parts, and thus the description thereof will be omitted. A difference between the present embodiment and the first embodiment is that the foreign matter observation sample 122 is connected to the retarding power source 206.

By such a configuration, a voltage that is the same as the voltage applied to the measurement sample 121 is applied to the foreign matter observation sample 122. That is, in the present embodiment, the environment of the foreign matter observation sample 122 is closer to the environment of the measurement sample 121, and thus the foreign matter of the measurement sample 121 can be estimated with higher accuracy.

Furthermore, it is preferable that the height of the surface of the foreign matter observation sample 122 is adjusted within a range of a height variation of the measurement sample 121. By bring the surface heights of the foreign matter observation sample 122 and the measurement sample 121 closer to each other, for example, an electric field formed between the foreign matter observation sample 122 and the shield electrode 108 and an electric field formed between the measurement sample 121 and the shield electrode 108 are equivalent to each other, and thus forces acting on the foreign matter are the same around the foreign matter observation sample 122 and the measurement sample 121. That is, the environments of the foreign matter observation sample 122 and the measurement sample 121 are closer to each other, and thus the foreign matter of the measurement sample 121 can be estimated with higher accuracy.

Third Embodiment

In the first embodiment, it has been described that by making the size of the foreign matter observation sample 122 sufficiently smaller than that of the measurement sample 121, it is possible to observe the foreign matter observation sample 122 in a short time. In the present embodiment, the time required for observing the foreign matter observing sample 122 can be further shortened. Matters described in the first embodiment and not described in the present embodiment can also be applied to the present embodiment unless there are special circumstances.

Figure 5:
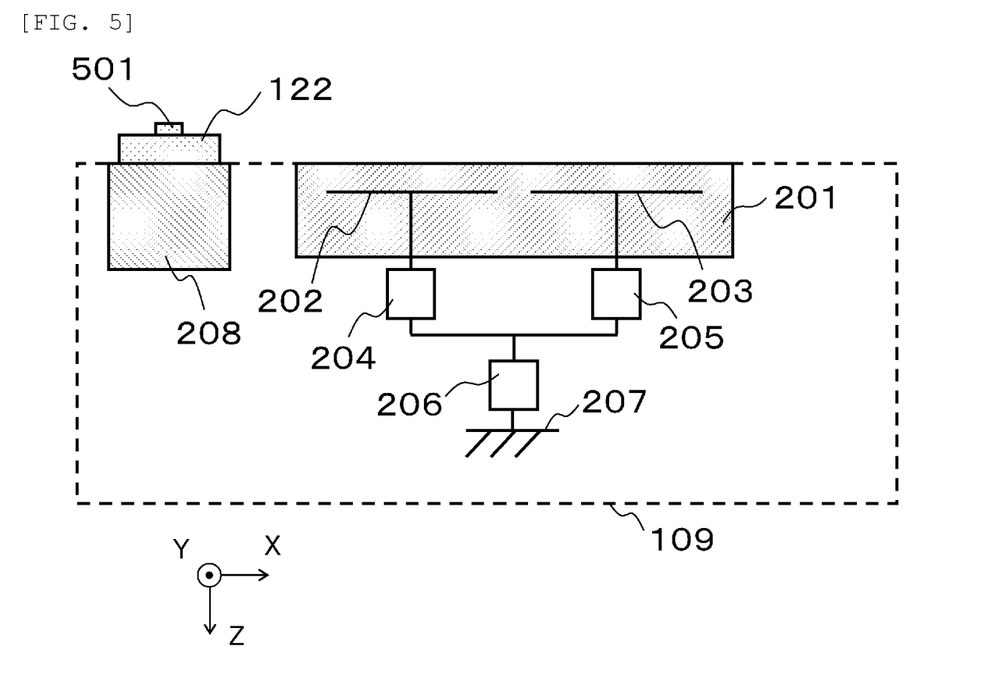
FIG. 5 is a diagram showing a sample stage according to a third embodiment.

The sample stage 109 according to the present embodiment will be described with reference to FIG. 5. Reference signs that are the same as those in the drawings referred to in the first embodiment show the same or corresponding parts, and thus the description thereof will be omitted. A difference between the present embodiment and the first embodiment is that the foreign matter observation sample 122 is provided with an alignment pattern 501. The pattern 501 has a shape that can be distinguished from the foreign matter. The shape may be an artificial shape such as a cross, a circle or a square, or a shape that combines these shapes. The pattern 501 is not limited to a convex shape with respect to the surface of the foreign matter observation sample 122 as shown in FIG. 5, and may be a concave shape. In order to easily grasp the position of the foreign matter in the foreign matter observation sample 122, the pattern 501 is preferably provided at a predetermined position of the foreign matter observation sample 122, for example, at the center or at a plurality of positions.

According to such a configuration, the pattern 501 is used for aligning the foreign matter observation sample 122 to be performed prior to observing the foreign matter observation sample 122, and thus the time required for aligning the foreign matter observing sample 122 can be shortened. That is, in the present embodiment, the foreign matter observation sample 122 can be aligned in a short time, and thus the time required for the observation including the alignment can be further shortened. Even there is no measurement sample 121, the foreign matter observation sample 122 can be aligned, and thus the measurement sample 121 is not shown in FIG. 5.

By observing the foreign matter observation sample 122 with reference to the position of the pattern 501, the position of the foreign matter in the foreign matter observation sample 122 can be grasped with high accuracy. If the position of the foreign matter in the foreign matter observation sample 122 can be grasped with high accuracy, the foreign matter in the measurement sample 121 can be estimated with higher accuracy.

Figure 6:
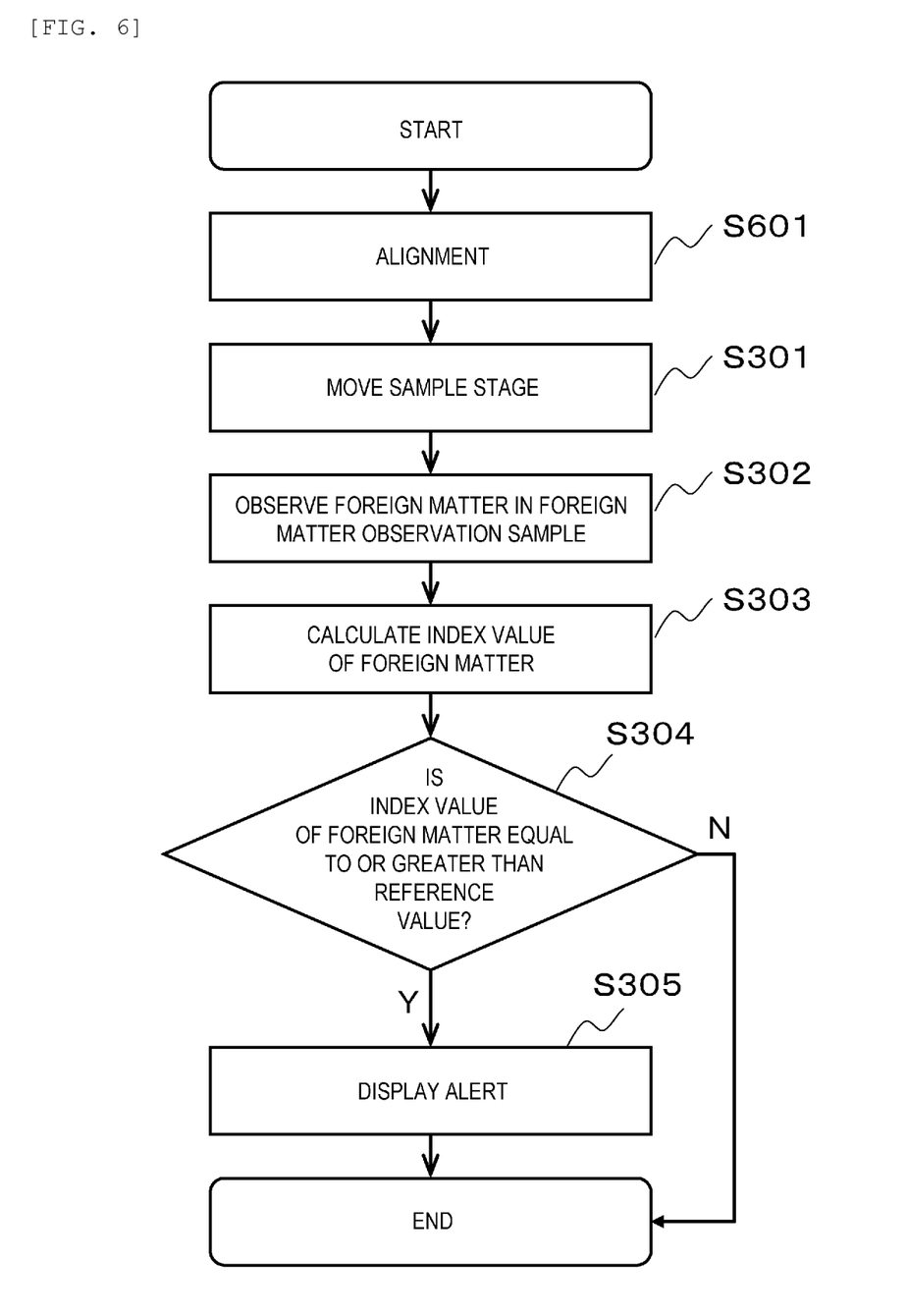
FIG. 6 is a diagram showing an example of a processing flow according to the third embodiment.

An example of a processing flow according to the present embodiment based on the configuration described with reference to FIGS. 1 and 5 will be described with reference to FIG. 6.

(S601)

By using the alignment pattern 501 provided on the foreign matter observation sample 122, the foreign matter observation sample 122 is aligned. For example, light is used for the alignment, and XY coordinates of the foreign matter observation sample 122 and a position in the Z direction are aligned. If the height of the surface of the foreign matter observation sample 122 is within a range of the height variation of the measurement sample 121, a time required for focusing the electron beam can be shortened when the measurement sample 121 is observed after the foreign matter observation sample 122 is observed.

A processing flow from S301 to S305 is the same as that according to the first embodiment, and thus the description thereof is omitted.

According to the processing flow described above, the time required for the observation of the foreign matter observation sample 122 including the alignment of the foreign matter observation sample 122 can be further shortened. Since the state of the foreign matter in the foreign matter observation sample 122 can be notified to the user, the user can estimate the state of the foreign matter in the measurement sample 121 held in the vicinity of the foreign matter observation sample 122. That is, according to the present embodiment, the charged particle beam apparatus capable of analyzing the foreign matter generated when the sample is transported or observed can be provided.

Fourth Embodiment

In the first embodiment, it has been described that the foreign matter observation sample 122 is observed using the optical microscope. In the present embodiment, in order to observe the foreign matter observation sample 122 in detail, a charged particle beam is used. Matters described in the first embodiment and not described in the present embodiment can also be applied to the present embodiment unless there are special circumstances.

Figure 7:
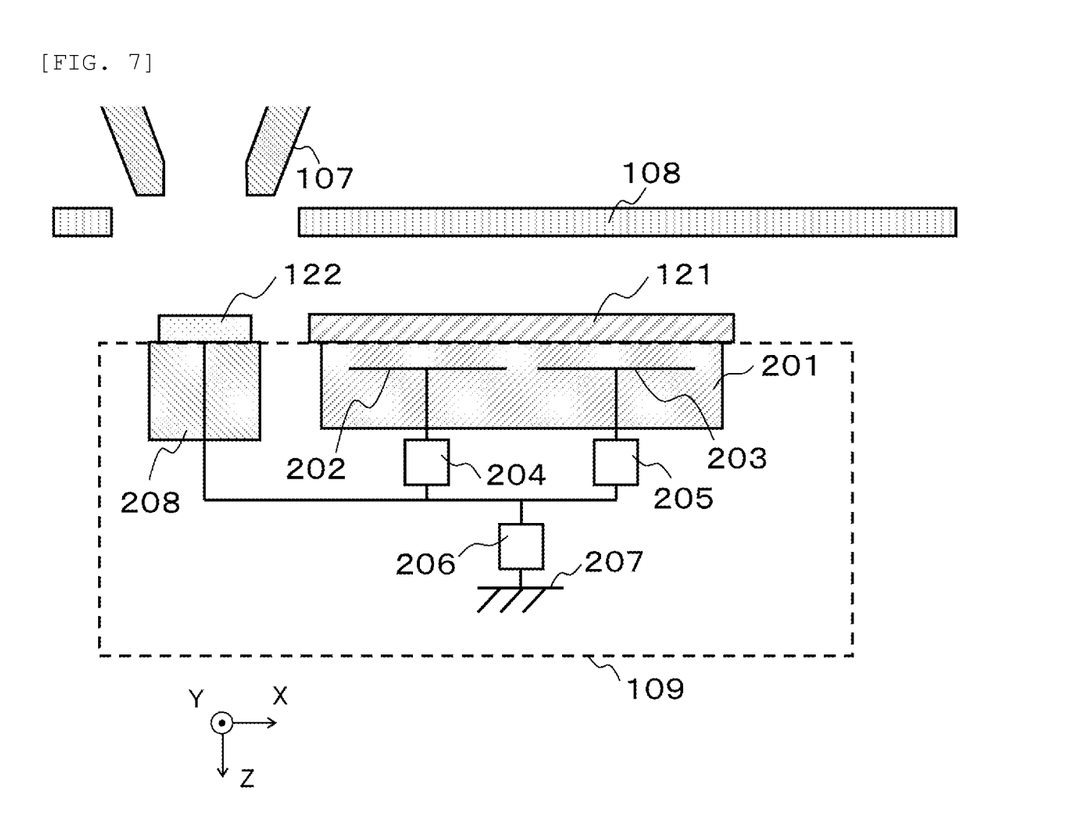
FIG. 7 is a diagram showing a sample stage according to a fourth embodiment.

The sample stage 109 according to the present embodiment will be described with reference to FIG. 7. Reference signs that are the same as those in the drawings referred to in the first embodiment show the same or corresponding parts, and thus the description thereof will be omitted. A difference between the present embodiment and the first embodiment is that the foreign matter observation sample 122 is moved to a position capable of being irradiated with an electron beam which is the charged particle beam. That is, the electron gun 101, the detector 105, and the control unit 111 function as the foreign matter observation unit. In order to bring the environment of the foreign matter observation sample 122 closer to the environment of the measurement sample 121, the foreign matter observation sample 122 may be connected to the retarding power source 206 as in the second embodiment.

According to such a configuration, a secondary electron or a back-scattered electron emitted by irradiating the foreign matter observation sample 122 with the electron beam is detected by the detector 105, and a secondary electron image or a back-scattered electron image of the foreign matter observation sample 122 is formed. The shape of the foreign matter in the foreign matter observation sample 122 is reflected on the secondary electron image and the composition of the foreign matter is reflected on the back-scattered electron image, and thus the foreign matter in the foreign matter observation sample 122 can be observed in detail and the generation factor of the foreign matter can be estimated based on a result of the detailed observation. For example, when the shape of the foreign matter is a flake shape, it can be estimated that the foreign matter is generated due to contact or friction of members and the like in the charged particle beam apparatus. When the shape of the foreign matter is a sphere shape, it can be estimated that the foreign matter is generated due to the melting of the members due to electric discharge or the like. In this way, in the present embodiment, the foreign matter in the foreign matter observation sample 122 can be observed in detail, and thus the foreign matter in the measurement sample 121 can be estimated with high accuracy.

By detecting X-rays emitted by irradiating the foreign matter observation sample 122 with the electron beam, the foreign matter can be analyzed and a composition thereof can be specified. If the composition of the foreign matter can be specified, the location where the foreign matter is generated can be estimated, so that an appropriate measure against the foreign matter can be taken.

Figure 8:
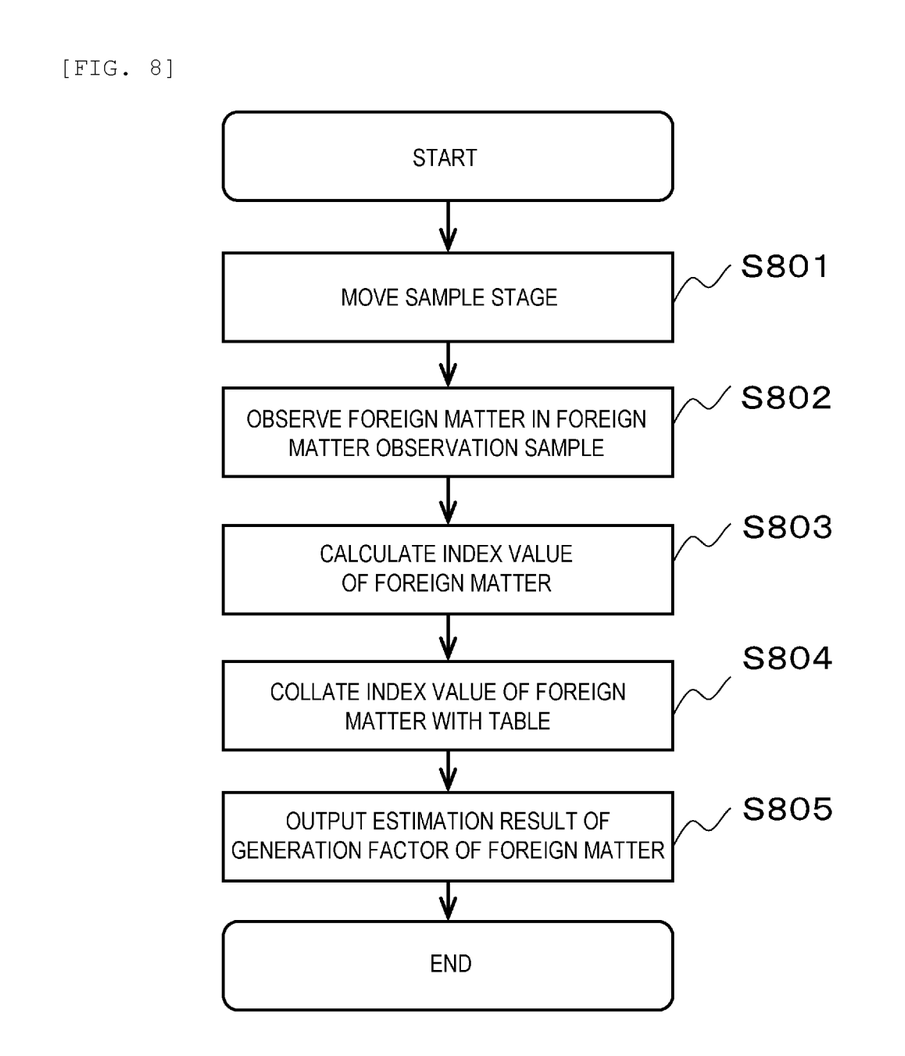
FIG. 8 is a diagram showing an example of a processing flow according to the fourth embodiment.

An example of a processing flow according to the present embodiment based on the configuration described with reference to FIGS. 1 and 7 will be described with reference to FIG. 8.

(S801)

The control unit 111 moves the sample stage 109 so that the foreign matter observation sample 122 is provided at a position that can be observed by the foreign matter observation unit, specifically, just below an opening of the objective lens 107.

(S802)

The foreign matter observation sample 122 is observed using the charged particle beam. That is, the secondary electron or the back-scattered electron emitted from the foreign matter observation sample 122 by the foreign matter observation sample 122 being irradiated with the electron beam is detected by the detector 105, and the secondary electron image or the back-scattered electron image of the foreign matter observation sample 122 is formed based on the detection signal output from the detector 105. The electron beam is a charged particle beam.

The foreign matter in the foreign matter observation sample 122 may be analyzed by detecting the X-rays emitted from the foreign matter observation sample 122. An analysis result of the foreign matter, the secondary electron image, and the back-scattered electron image are appropriately displayed on the display unit of the input and output unit 112.

(S803)

The control unit 111 calculates an index value of the foreign matter based on the observation in S802. In the present step, the calculated index value of the foreign matter is, for example, the position, a particle size, the shape, and the composition of the foreign matter. The position, the particle size or the like of the foreign matter may be divided into a plurality of levels, the foreign matter may be counted for each level, and a histogram may be created. The calculated index value and the like of the foreign matter are displayed on the display unit of the input and output unit 112 as necessary.

(S804)

Figure 9:
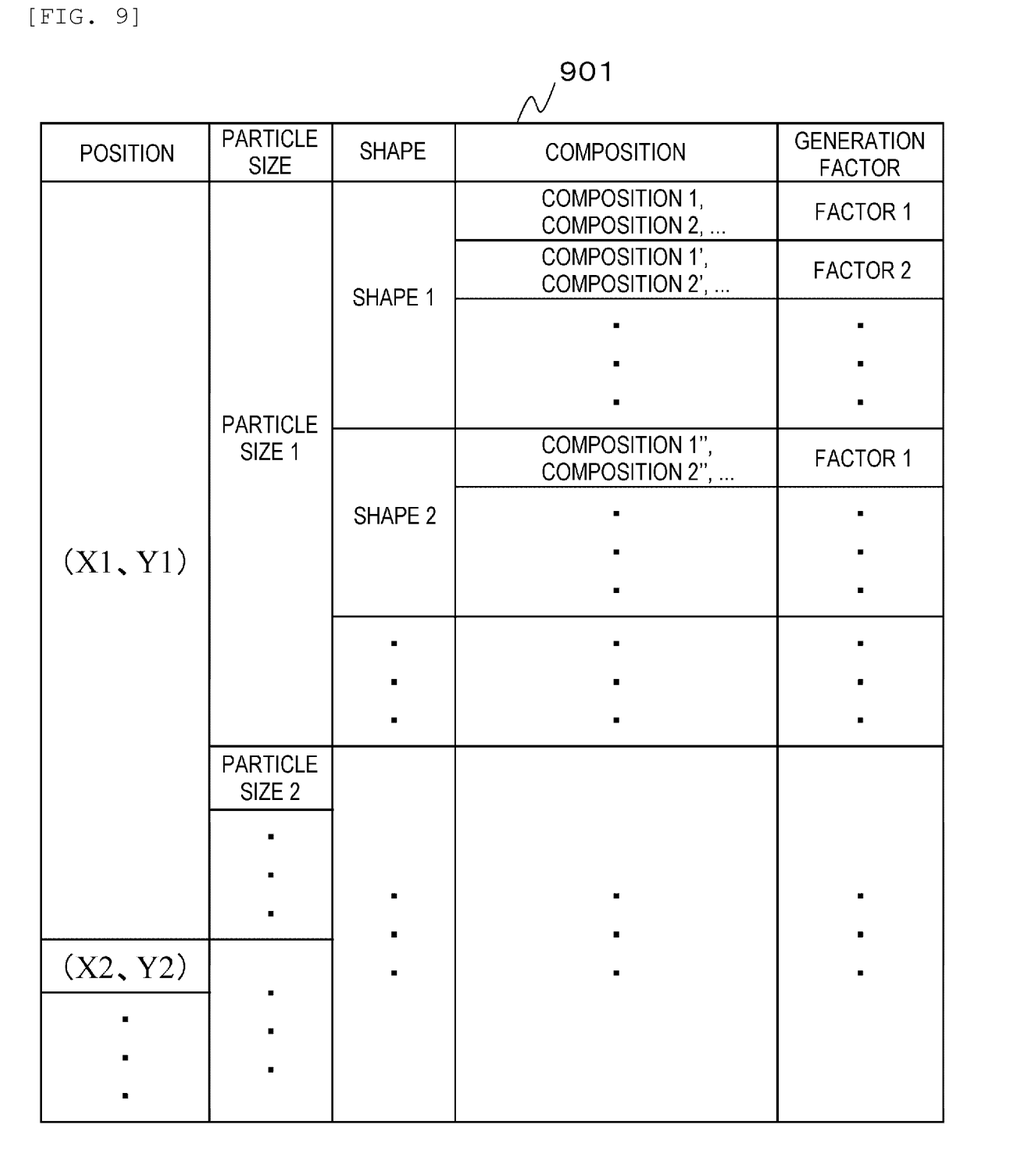
FIG. 9 is a diagram showing an example of a table according to the fourth embodiment.

The control unit 111 collates the index value of the foreign matter calculated in S803 with a table 901 shown in FIG. 9. The table 901 associates the index value such as the position, the particle size, the shape, and the composition of the foreign matter with the generation factor of the foreign matter, and is created in advance and stored in the storage unit 113. In the present step, by collating the table, in which the index value of the foreign matter read from the storage unit 113 and the generation factor are associated, with the index value of the foreign matter calculated in S803, the generation factor of the foreign matter is estimated.

(S805)

The control unit 111 displays the generation factor of the foreign matter estimated in S804 on the display unit of the input and output unit 112. By displaying an estimation result of the generation factor of the foreign matter, it is possible to prompt the user to take an appropriate measure against the foreign matter according to the generation factor of the foreign matter. The table stored in the storage unit 113 is not limited to the one shown in FIG. 9, and the index value of the foreign matter included in the table may be plural or singular. The measure against the foreign matter according to the generation factor of the foreign matter may be included in the table. By including the measure against the foreign matter in the table, the user can quickly take the measure against the foreign matter.

According to the processing flow described above, the foreign matter in the foreign matter observation sample 122 can be observed in detail, and the estimation result of the generation factor of the foreign matter can be notified to the user. As a result, the user can quickly take a more appropriate measure against the foreign matter.

Fifth Embodiment

In the first embodiment to the fourth embodiment, a case in which the foreign matter observation sample provided in the vicinity of the measurement sample 121 is singular has been described. In the present embodiment, a case in which the foreign matter observation samples are plural will be described. Matters described in the first embodiment to the fourth embodiment and not described in the present embodiment can also be applied to the present embodiment unless there are special circumstances.

Figure 10:
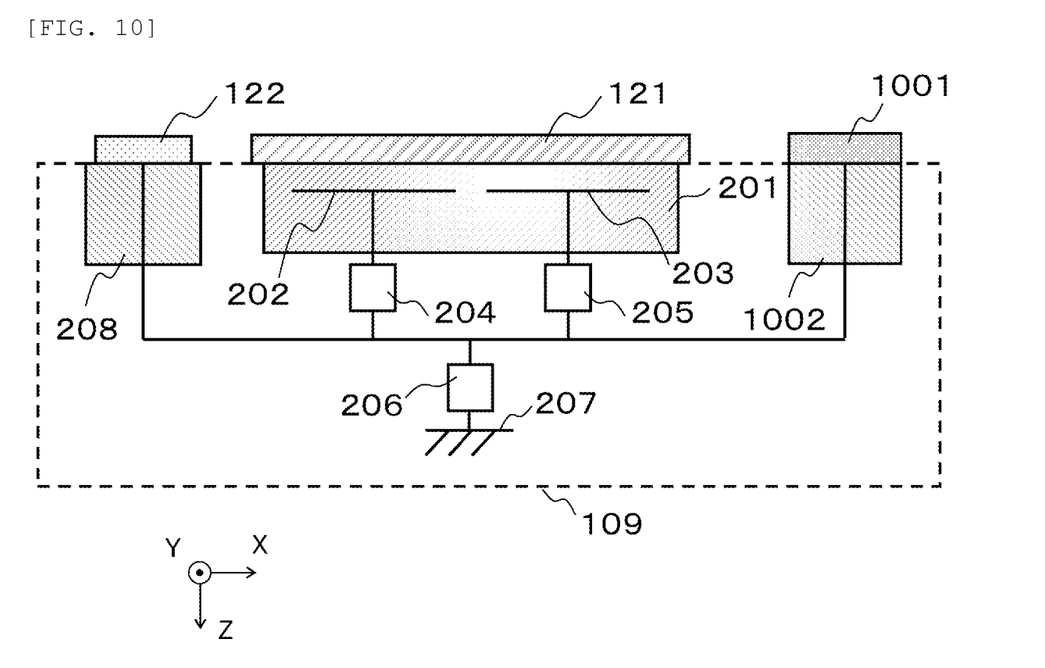
FIG. 10 is a diagram showing a sample stage according to a fifth embodiment.

The sample stage 109 according to the present embodiment will be described with reference to FIG. 10. Reference signs that are the same as those in the drawings referred to in the first embodiment to the fourth embodiment show the same or corresponding parts, and thus the description thereof will be omitted. A difference between the present embodiment and the first embodiment to the fourth embodiment is that a plurality of foreign matter observation samples are provided in the vicinity of the measurement sample 121. That is, the sample stage 109 according to the present embodiment includes the electrostatic chuck 201, the holding base 208, and a holding base 1002.

The holding base 1002 holds a foreign matter observation sample 1001 different from the foreign matter observation sample 122 held on the holding base 208, and is provided at a position different from that of the holding table 208 and in the vicinity of the measurement sample 121, for example, at a position where the electromagnetic field substantially equivalent to the electromagnetic field formed on the measurement sample 121 is formed. That is, environments of the foreign matter observation sample 1001 and the measurement sample 121 are substantially the same. As in the foreign matter observation sample 122, the foreign matter observation sample 1001 is sufficiently smaller in size than the measurement sample 121, and is in a state in which the foreign matter has been removed prior to the observation of the measurement sample 121 or a state in which the position, the number and the like of the foreign matters have been checked. The surface of the foreign matter observation sample 1001 is preferably a mirror surface. The number of the foreign matter observation samples is not limited to two, and may be three or more.

According to such a configuration, the foreign matter can be detected at a different position in the vicinity of the measurement sample 121, and thus it is possible to grasp a spatial distribution of the foreign matter generated during the observation of the measurement sample 121. By grasping the spatial distribution of the foreign matter, it is possible to accurately analyze the generation factor of the foreign matter, and it is possible to take a more appropriate measure against the foreign matter.

The foreign matter observation sample 1001 may have a surface roughness different from that of the foreign matter observation sample 122. A metallic foreign matter is likely to adhere to a surface having a small surface roughness, and thus, for example, by making the surface roughness of the foreign matter observation sample 1001 smaller than that of the foreign matter observation sample 122, a generation condition of the foreign matter can be acceleratedly evaluated using the foreign matter observation sample 1001. On the other hand, a metallic foreign matter is less likely to adhere to the foreign matter observation sample 122 than the foreign matter observation sample 1001, and thus the foreign matter observation sample 122 can be used for a long period of time without being cleaned. The ease of adhesion of the foreign matter also depends on the material, and thus the foreign matter observation sample 1001 may be made of a material different from that of the foreign matter observation sample 122.

The light scattering and the detection signal of the charged particles change depending on the surface roughness and the material, and thus images obtained by observing the foreign matter observation samples having different surface roughness or materials may be compared with each other. For example, in a state where the foreign matter observation sample 1001 and the foreign matter observation sample 122 are made of different materials, the back-scattered electron images of the foreign matter observation sample 1001 and the foreign matter observation sample 122 are acquired, and the back-scattered electron image of the foreign matter observation sample 1001 and the back-scattered electron image of the foreign matter observation sample 122 are compared. Accordingly, the foreign matter is easily detected.

As described above, a plurality of embodiments of the charged particle beam apparatus according to the invention are described. The invention is not limited to the above embodiments, and constituent elements may be modified and embodied without departing from the spirit of the invention. A plurality of constituent elements disclosed in the above embodiments may be appropriately combined. Furthermore, some constituent elements may be omitted from all the constituent elements shown in the above embodiments.

REFERENCE SIGN LIST

101 electron gun
102 first condenser lens 103 aperture
104 second condenser lens
105 detector
106 scanning deflector
107 objective lens
108 shield electrode
109 sample stage
110 housing
111 control unit
112 input and output unit
113 storage unit
115 foreign matter observation unit
121 measurement sample
122 foreign matter observation sample
201 electrostatic chuck
202, 203 electrostatic chuck electrode
204, 205 electrostatic chuck power source
206 retarding power source
207 ground
208 holding base
501 pattern
901 table
1001 foreign matter observation sample
1002 holding base

The invention claimed is:

1. A charged particle beam apparatus comprising:
a sample stage comprising an electrostatic chuck configured to hold a measurement sample and a holding base disposed apart from the electrostatic chuck;
a charged particle beam source configured to irradiate the measurement sample with a charged particle beam;
a detector configured to detect a charged particle emitted by irradiation with the charged particle beam;
a foreign matter observation sample bonded to the holding base and disposed on the sample stage adjacent to the measurement sample; and
an optical microscope configured to observe a foreign matter on the foreign matter observation sample.

2. The charged particle beam apparatus according to claim 1, wherein
the charged particle beam apparatus is configured to apply to the foreign matter observation sample a voltage that is the same as a voltage applied to the measurement sample.

3. The charged particle beam apparatus according to claim 1, wherein
the foreign matter observation sample has an alignment pattern.

4. The charged particle beam apparatus according to claim 1, wherein
the foreign matter observation sample has a surface roughness different from that of other members other than the measurement sample.

5. The charged particle beam apparatus according to claim 1, wherein
the foreign matter observation sample is made of a material different from that of other members other than the measurement sample.

6. The charged particle beam apparatus according to claim 1, wherein
the sample stage is a movable stage; and
the charged particle beam apparatus is configured to observe the foreign matter by irradiating the foreign matter observation sample using the charged particle beam.

7. The charged particle beam apparatus according to claim 1, further comprising:
a plurality of the foreign matter observation samples being held on the sample stage.

8. The charged particle beam apparatus according to claim 7, wherein
the foreign matter observation samples have different surface roughness.

9. The charged particle beam apparatus according to claim 7, wherein
the foreign matter observation samples are made of different materials.

10. The charged particle beam apparatus according to claim 7, wherein
each said foreign matter observation sample has a smaller size than a size of the measurement sample.

11. The charged particle beam apparatus according to claim 1, wherein
the foreign matter observation sample has a smaller size than a size of the measurement sample.

* * * * *